US011443950B2

(12) United States Patent
Nelson

(10) Patent No.: US 11,443,950 B2
(45) Date of Patent: Sep. 13, 2022

(54) METHOD FOR FIGURE CONTROL OF OPTICAL SURFACES

(71) Applicant: Zygo Corporation, Middlefield, CT (US)

(72) Inventor: Andrew Nelson, Portland, CT (US)

(73) Assignee: Zygo Corporation, Middlefield, CT (US)

( * ) Notice: Subject to any disclaimer, the term of this patent is extended or adjusted under 35 U.S.C. 154(b) by 139 days.

(21) Appl. No.: 16/800,270

(22) Filed: Feb. 25, 2020

(65) Prior Publication Data

US 2020/0279746 A1 Sep. 3, 2020

Related U.S. Application Data

(60) Provisional application No. 62/812,663, filed on Mar. 1, 2019.

(51) Int. Cl.

*H01L 21/302* (2006.01)
*C03C 15/00* (2006.01)
*C03C 15/02* (2006.01)
*C03C 25/68* (2006.01)

(Continued)

(52) U.S. Cl.

CPC ............ *H01L 21/302* (2013.01); *C03C 15/00* (2013.01); *C03C 15/02* (2013.01); *C03C 25/68* (2013.01); *G02B 26/101* (2013.01); *H01L 21/681* (2013.01)

(58) Field of Classification Search

None

See application file for complete search history.

(56) References Cited

U.S. PATENT DOCUMENTS

| | | | | |
|---|---|---|---|---|
| 2003/0160025 A1 | 8/2003 | Rushford | | |
| 2012/0103520 A1 * | 5/2012 | Lee | ......................... | B24B 49/12 156/345.15 |
| 2019/0047906 A1 * | 2/2019 | Weber | ..................... | C03C 15/00 |

FOREIGN PATENT DOCUMENTS

| | | | |
|---|---|---|---|
| WO | WO 02/32825 | 4/2002 | ............. C03C 15/00 |
| WO | WO-2017132303 A1 * | 8/2017 | ............. C03C 15/00 |

OTHER PUBLICATIONS

The International Preliminary Report on Patentability for International Application No. PCT/US2020/019649, dated Sep. 16, 2021.

(Continued)

*Primary Examiner* — Stephanie P Duclair

(74) *Attorney, Agent, or Firm* — Fish & Richardson P.C.

(57) ABSTRACT

A method for figuring an optical surface of an optical element to achieve a target profile for the optical surface includes: applying a removal process to an extended region of the optical surface extending along a first direction to remove material from the extended region of the optical surface; adjusting a position of the optical surface relative to the removal process along a second direction perpendicular to the first direction to remove material from additional extended regions of the optical surface extending along the first direction at each of different positions of the optical surface along the second direction; and repeating the applying of the removal process and the adjusting of the optical surface relative to the removal process for each of multiple rotational orientations of the optical surface about a third direction perpendicular to the first and second directions to achieve the target profile of the optical surface.

24 Claims, 7 Drawing Sheets

(51) Int. Cl.
*G02B 26/10* (2006.01)
*H01L 21/68* (2006.01)

(56) References Cited

OTHER PUBLICATIONS

The International Search Report and Written Opinion of the International Searching Authority for International Application No. PCT/US2020/019649 dated May 28, 2020.
Nelson, A., "A Technique to Control Global Figure Using Acid Immersion and Zernike Decomposition." in Optical Design and Fabrication 2019 (Freeform, OFT), OSA Technical Digest (Optical Society of America, Jun. 2019), paper OT1A.6.
Schaefer, D., "Basics of ion beam figuring and challenges for real optics treatment", *Proceedings of SPIE*, vol. 10829, pp. 1082907-1-1082907-8 (2018).
Spierings, G.A. C., "Wet chemical etching of silicate glasses in hydrofluoric acid based solutions", *Journal of Materials Science*, vol. 28, pp. 6262-6273 (1993).
Suratwala, T., "Part I, Fundamental Interactions—Materials Science", *Materials Science and Technology of Optical Fabrication*, Chapter 1(Wiley, 2018).
"Zernike Polynomials", *Wikipedia* (Jun. 5, 2020).

* cited by examiner

| n | m | Term # | Polynomial | Meaning |
|---|---|---|---|---|
| 0 | 0 | 0 | $1$ | Piston |
| 1 | +1 | 1 | $\rho \cos \phi$ | X Tilt |
| | -1 | 2 | $\rho \sin \phi$ | Y Tilt |
| | 0 | 3 | $2\rho^2-1$ | Focus |
| 2 | +2 | 4 | $\rho^2 \cos 2\phi$ | Astigmatism 0° or 90° |
| | -2 | 5 | $\rho^2 \sin 2\phi$ | Astigmatism ±45° |
| | +1 | 6 | $(3\rho^2-2)\rho \cos \phi$ | X Coma and Tilt |
| | -1 | 7 | $(3\rho^2-2)\rho \sin \phi$ | Y Coma and Tilt |
| | 0 | 8 | $6\rho^4-6\rho^2+1$ | Spherical and Focus |
| 3 | +3 | 9 | $\rho^3 \cos 3\phi$ | |
| | -3 | 10 | $\rho^3 \sin 3\phi$ | |
| | +2 | 11 | $(4\rho^2-3)\rho^2 \cos 2\phi$ | |
| | -2 | 12 | $(4\rho^2-3)\rho^2 \sin 2\phi$ | |
| | +1 | 13 | $(10\rho^4-12\rho^2+3)\rho \cos \phi$ | |
| | -1 | 14 | $(10\rho^4-12\rho^2+3)\rho \sin \phi$ | |
| | 0 | 15 | $20\rho^6-30\rho^4+12\rho^2-1$ | |
| 4 | +4 | 16 | $\rho^4 \cos 4\phi$ | |
| | -4 | 17 | $\rho^4 \sin 4\phi$ | |
| | +3 | 18 | $(5\rho^2-4)\rho^3 \cos 3\phi$ | |
| | -3 | 19 | $(5\rho^2-4)\rho^3 \sin 3\phi$ | |
| | +2 | 20 | $(15\rho^4-20\rho^2+6)\rho^2 \cos 2\phi$ | |
| | -2 | 21 | $(15\rho^4-20\rho^2+6)\rho^2 \sin 2\phi$ | |
| | +1 | 22 | $(35\rho^6-60\rho^4+30\rho^2-4)\rho \cos \phi$ | |
| | -1 | 23 | $(35\rho^6-60\rho^4+30\rho^2-4)\rho \sin \phi$ | |
| | 0 | 24 | $70\rho^8-140\rho^6+90\rho^4-20\rho^2+1$ | |
| 5 | +5 | 25 | $\rho^5 \cos 5\phi$ | |
| | -5 | 26 | $\rho^5 \sin 5\phi$ | |
| | +4 | 27 | $(6\rho^2-5)\rho^4 \cos 4\phi$ | |
| | -4 | 28 | $(6\rho^2-5)\rho^4 \sin 4\phi$ | |
| | +3 | 29 | $(21\rho^4-30\rho^2+10)\rho^3 \cos 3\phi$ | |
| | -3 | 30 | $(21\rho^4-30\rho^2+10)\rho^3 \sin 3\phi$ | |
| | +2 | 31 | $(56\rho^6-105\rho^4+60\rho^2-10)\rho^2 \cos 2\phi$ | |
| | -2 | 32 | $(56\rho^6-105\rho^4+60\rho^2-10)\rho^2 \sin 2\phi$ | |
| | +1 | 33 | $(126\rho^8-280\rho^6+210\rho^4-60\rho^2+5)\rho \cos \phi$ | |
| | -1 | 34 | $(126\rho^8-280\rho^6+210\rho^4-60\rho^2+5)\rho \sin \phi$ | |
| | 0 | 35 | $252\rho^{10}-630\rho^8+560\rho^6-210\rho^4+30\rho^2-1$ | |

FIG. 2

$$
Zem(z,y) := \begin{bmatrix}
0 & 0 & Z_1 \cdot y & 0 \\
Z_2 \cdot y & 0 & 0 & 0 \\
Z_3 \cdot \left(2y^2-1\right) & 0 & Z_3 \cdot 2y^2 & 0 \\
Z_4 \cdot -y^2 & 0 & Z_4 y^2 & 0 \\
0 & Z_5 y^2 & 0 & Z_5 \cdot -y^2 \\
0 & Z_6 \cdot \sqrt{2} y \cdot \frac{\left(2y^2-1\right)}{2} & 0 & 0 \\
Z_7 \cdot \left(2y^3-y\right) & Z_7 \cdot \sqrt{2} y \cdot \frac{\left(2y^2-1\right)}{2} & 0 & Z_7 \cdot \sqrt{2} y \cdot \frac{\left(2y^2-1\right)}{2} \\
Z_8 \cdot \left(2y^4-\frac{3}{2}y^2+\frac{1}{8}\right) & Z_8 \cdot \left(2y^4-\frac{3}{2}y^2+\frac{1}{8}\right) & Z_8 \cdot \left(2y^4-\frac{3}{2}y^2+\frac{1}{8}\right) & Z_8 \cdot \left(2y^4-\frac{3}{2}y^2+\frac{1}{8}\right) \\
0 & \frac{Z_9 \cdot \sqrt{2} y}{2} y.\left(2y^2-1\right) & 0 & 0 \\
Z_{10} \cdot \left(y-2y^3\right) & \frac{Z_{10} \sqrt{2}}{2} y.\left(2y^2-1\right) & 0 & \frac{Z_{10} \cdot \sqrt{2} y}{2} y \cdot \left(2y^2-1\right) \\
Z_{11} \left(3y^2-4y^4\right) & 0 & Z_{11} y \cdot \left(4y^2-3\right) & 0 \\
y^2 \cdot \left(4y^2-3\right) . Z_{12} & 0 & 0 & 0 \\
0 & Z_{13} \cdot \left(-81 \frac{\sqrt{2}}{328}\right) y \cdot \left(4y^2-3\right) \cdot (2 \cdot y-1) \cdot (2y+1) & Z_{13} \cdot \left(\frac{-3}{656}\right) y \cdot \left(4y^2-3\right) \cdot (2 \cdot y-1) \cdot (2y+1) & Z_{13} \cdot \left(-73 \frac{\sqrt{2}}{328}\right) y \cdot \left(4y^2-3\right) \cdot (2 \cdot y-1) \cdot (2y+1) \\
Z_{14} \cdot \left(\frac{79}{164}\right) y \cdot \left(4y^2-3\right) \cdot (2 \cdot y-1) \cdot (2y+1) & Z_{14} \cdot \left(9 \frac{\sqrt{2}}{328}\right) y \cdot \left(4y^2-3\right) \cdot (2 \cdot y-1) \cdot (2y+1) & 0 & Z_{14} \cdot \left(-81 \frac{\sqrt{2}}{328}\right) y \cdot \left(4y^2-3\right) \cdot (2 \cdot y-1) \cdot (2y+1) \\
Z_{15} \cdot \left(8y^6-10y^4+3y^2-\frac{1}{8}\right) & Z_{15} \cdot \left(8y^6-10y^4+3y^2-\frac{1}{8}\right) & Z_{15} \cdot \left(8y^6-10y^4+3y^2-\frac{1}{8}\right) & Z_{15} \cdot \left(8y^6-10y^4+3y^2-\frac{1}{8}\right)
\end{bmatrix}
$$

FIG. 5

$$
\begin{bmatrix}
0 & 0 & 0 & 0 \\
0 & 0 & 0 & 0 \\
0 & 0 & 0 & 0 \\
0 & 0 & 0 & 0 \\
0 & 0 & 0 & 0 \\
0 & 0 & Z_6\cdot(2y^3-y) & Z_6\cdot\sqrt{2}y\cdot\frac{(2y^2-1)}{2} \\
0 & 0 & 0 & 0 \\
Z_8\cdot\left(2y^4-\frac{3}{2}y^2+\frac{1}{8}\right) & Z_8\cdot\left(2y^4-\frac{3}{2}y^2+\frac{1}{8}\right) & Z_8\cdot\left(2y^4-\frac{3}{2}y^2+\frac{1}{8}\right) & Z_8\cdot\left(2y^4-\frac{3}{2}y^2+\frac{1}{8}\right) \\
0 & 0 & Z_9\cdot\left(y-2\cdot y^3\right) & \frac{Z_9\sqrt{2}}{2}y\cdot(2y^2-1) \\
0 & 0 & 0 & 0 \\
0 & 0 & 0 & 0 \\
0 & 0 & Z_{12}\cdot\left(3y^2-4y^4\right) & 0 \\
0 & Z_{13}\cdot\left(\frac{\sqrt{2}}{328}\right)\cdot y\cdot\left(4y^2-3\right)\cdot(2\cdot y-1)\cdot(2y+1) & Z_{13}\cdot\left(\frac{79}{164}\right)\cdot y\cdot\left(4y^2-3\right)\cdot(2\cdot y-1)\cdot(2y+1) & Z_{13}\cdot\left(9\frac{\sqrt{2}}{328}\right)\cdot y\cdot\left(4y^2-3\right)\cdot(2\cdot y-1)\cdot(2y+1) \\
Z_{14}\cdot\left(\frac{-3}{656}\right)\cdot y\cdot\left(4y^2-3\right)\cdot(2\cdot y-1)\cdot(2y+1) & Z_{14}\cdot\left(-73\frac{\sqrt{2}}{328}\right)\cdot y\cdot\left(4y^2-3\right)\cdot(2\cdot y-1)\cdot(2y+1) & 0 & Z_{14}\cdot\left(\frac{\sqrt{2}}{328}\right)\cdot y\cdot\left(4y^2-3\right)\cdot(2\cdot y-1)\cdot(2y+1) \\
Z_{15}\cdot\left(8y^6-10y^4+3y^2-\frac{1}{8}\right) & Z_{15}\cdot\left(8y^6-10y^4+3y^2-\frac{1}{8}\right) & Z_{15}\cdot\left(8y^6-10y^4+3y^2-\frac{1}{8}\right) & Z_{15}\cdot\left(8y^6-10y^4+3y^2-\frac{1}{8}\right)
\end{bmatrix}
$$

FIG. 5 (cont.)

METHOD FOR FIGURE CONTROL OF OPTICAL SURFACES

CROSS REFERENCE TO RELATED APPLICATION

This application claims priority to U.S. Provisional Patent Application No. 62/812,663, filed on Mar. 1, 2019, pursuant to 35 USC § 119. The entire content of this provisional application is herein incorporated by reference in its entirety.

BACKGROUND

The manufacturing of an optical element typically involves the shaping (or "figuring") of at least on optical surface of the element relative to a target profile for the optical surface. This target surface can be a plane, a sphere, or some other defined form such as an aspheric surface or even a free form surface. Techniques for achieving such profiles are varied and typically involve grinding and polishing over the full aperture of the optical element. For higher precision optics, the techniques typically further involve deterministic local (or "sub-aperture") processing of the optical surface to achieve the target profile.

Sub-aperture figuring involves the use of some small (relative to the size of the substrate) removal function that dwells across the surface at varying speeds to locally remove material in sub regions of a larger substrate to correct the global figure. There are many technologies available to perform sub-aperture figure correction. Magneto-rheological Finishing (MRF) is a common commercially available technique. Ion Beam Figuring (IBF) is another method that is heavily leveraged due to the stability of the removal function. Most sub-aperture finishing techniques are limited in some way by physical constraints (e.g., pressures applied, tool wear, tool displacement tolerances, machine velocity or acceleration constraints, etc . . . ) and are also typically limited in volumetric removal rate when used in any reasonably stable conditions due to the local nature of the process. This can lead to long processing times. Other limitations to this type of processing sometimes include, for example, degradation in the micro-roughness, issues with surface quality, introduction of mid-spatial surface error, and edge exclusion.

As a result, it is common for multiple processing techniques to be used to figure a single optical element. For example, it is common to use a figuring technique in a larger 'bulk' removal mode to correct the longer spatial length surface error and then switch modes to use a smaller removal function to address the higher spatial periods in a substrate. This is done to increase convergence efficiency and minimize the process time.

In sum, the determinism of sub-aperture processing provides a great advantage to efficiently shape optical substrates. However, this can come with trade-offs in surface quality, edge effects, roughness, run-time, or a degradation in the higher spatial frequency characterization of the surface. Such trade-offs can be increasingly problematic when a relatively large volume of material must be removed to achieve the desired results, as is generally the case for large optical elements.

SUMMARY

Disclosed herein are embodiments for a method for figuring optical surfaces. Embodiments address issues with conventional sub-aperture finishing and still maintain a high level of determinism. They involve a mix of global and local figuring approaches to provide removal rate efficiency comparable to full aperture processes and the determinism of a sub-aperture processes.

In general, in one aspect, a method for figuring an optical surface of an optical element to achieve a target profile for the optical surface is disclosed. The method includes: a) applying a removal process to an extended region of the optical surface extending along a first direction to remove material from the extended region of the optical surface; and b) adjusting a position of the optical surface relative to the removal process along a second direction perpendicular to the first direction to remove material from additional extended regions of the optical surface extending along the first direction at each of different positions of the optical surface along the second direction. During the applying of the removal process and the adjusting of the optical surface relative to the removal process, the optical surface has a first rotational orientation about a third direction perpendicular to the first and second directions. The method further includes: c) repeating the applying of the removal process and the adjusting of the optical surface relative to the removal process for each of one or more additional rotational orientations of the optical surface about the third direction to achieve the target profile of the optical surface.

Embodiments of the method may include one or more of the following features.

The extended region of the optical surface extending along the first direction from which material is removed by the removal process may extend across a full aperture of the optical surface along the first direction. In certain embodiments, a full aperture of the optical surface is greater than 25 cm, or greater than 50 cm, or even greater than 100 cm.

The removal process is preferably laterally extended along the first direction to simultaneously and/or uniformly remove the material from the region of the optical surface extending along the first direction.

The removal process may be an etching process wherein at least part of the optical surface is immersed into an etching bath. For example, the adjusting of the optical surface relative to the removal process may include immersing the optical surface into the etching bath along the second direction. Furthermore, immersing the optical surface into the etching bath along the second direction may include varying a speed of the immersion of the optical surface into the etching bath along the second direction to cause a rate at which the material at the additional extended regions of the optical surface extending along the first direction are removed at each of the different positions of the optical surface along the second direction to vary nonlinearly with respect to distance along the second direction. In such cases, the extended regions of the optical surface that are immersed in the etching bath may have material continuously removed by the etching bath in proportion to a dwell time in the etching bath for each of the extended regions. In certain embodiment, the method may further include adjusting a temperature of the etchant bath to adjust an etching rate for the removal process.

In certain other embodiments, the removal process is an ion beam etching process, wherein a dimension of the ion beam for the ion beam etching process along the first direction is at least ten times greater than a dimension of the ion beam along the second direction.

In certain other embodiments, the removal process is a magneto-rheological finishing processing implementing a cylindrical head to provide laterally extended removal process.

More generally, for any removal process, adjusting the position of the optical surface relative to the removal process along the second direction may include varying a speed of the relative positioning along the second direction to cause a rate at which the material at the additional extended regions of the optical surface extending along the first direction are removed at each of the different positions of the optical surface along the second direction to vary nonlinearly with respect to distance along the second direction.

The method may further include mounting the optical element in a fixture to establish an initial rotational orientation of the optical surface about the third direction prior to an initial application of the removal process to the optical surface. Furthermore, the method may further include reorienting the optical element in the fixture to establish each of the one or more additional rotational orientations of the optical surface prior to repeating each of the corresponding applications of the removal process and adjustments of the optical surface relative to the removal process.

For example, the first rotational orientation and the one or more additional rotational orientations collectively include at least four different rotational orientations, eight different orientations, or even more than eight different orientations. In certain preferred embodiments, for example, the at least four different rotational orientations may be selected from rotations corresponding to integer multiples of 45 degrees.

The method may further include expressing the target profile for the figuring of the optical surface as a superposition of polynomial functions of a coordinate for the second dimension for each of the first rotational orientation and the one or more additional rotational orientations. For example, the adjustment of the optical surface relative to the removal process along the second direction for each of the first rotational orientation and the one or more additional rotational orientations may be based on the polynomial function for each corresponding one of the first rotational orientation and the one or more additional rotational orientations. Furthermore, a speed of the adjustment of the optical surface relative to the removal process along the second direction for each of the first rotational orientation and the one or more additional rotational orientations may correspond to a derivative of the polynomial function with respect to the coordinate for the second dimension for each corresponding one of the first rotational orientation and the one or more additional rotational orientations.

In certain embodiments, a desired profile for the figuring of the optical surface can be expressed in terms of coefficients for a set of Zernike polynomials, and the method may include approximating the desired profile with the target profile expressed as the superposition of polynomial functions for each of the first rotational orientation and the one or more additional rotational orientations.

Embodiments of the method may include any of the following advantages: i) high 'effective' removal rates for large substrates; ii) batch processing for similar figure errors, thereby increasing throughput; iii) metrology limited wedge control and/or zero edge degradation; iv) profiling of free-form and aspheric geometries; v) profiling of high-aspect ratio or mechanically fragile substrates; vi) processing that is inherently free of subsurface damage and/or defect contamination (e.g., scratches/digs); vii) minimal roughness degradation on fused silica; and viii) simple implementation and high determinism, at low cost and high-throughput.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 is a table list the first thirty-six Zernike polynomials.

FIG. 5 is an exemplary numerical matrix for the one-dimension correction along the Y-axis for each of eight 45-degree increment rotations necessary to correct for a surface error correction expressed in terms of the first sixteen Zernike polynomials ($z_1$, $z_2$, . . . $z_{16}$).

Like reference symbols in the various drawings indicate like elements.

DETAILED DESCRIPTION

Figure 1A:
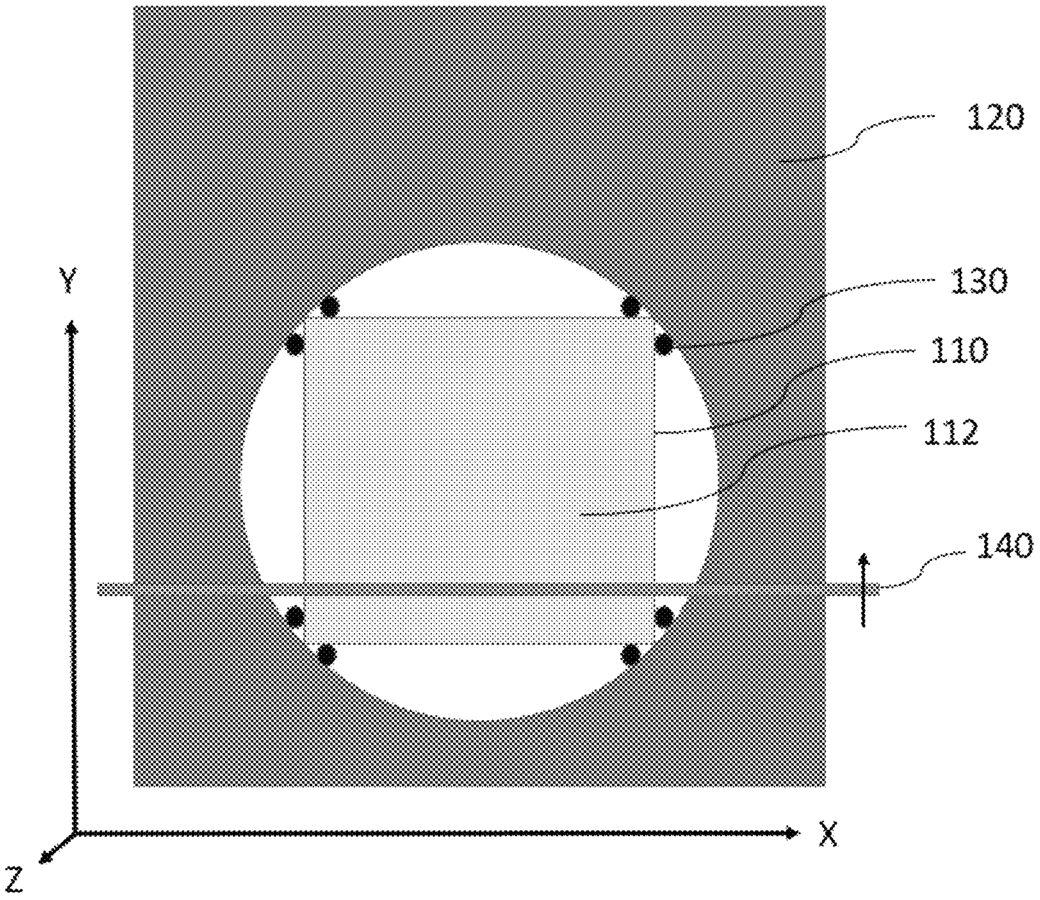
FIGS. 1A and 1B are schematic diagrams illustrating the method for two angular orientations of the optical surface 112 being processed (0-degrees in FIG. 1A and 45-degrees in FIG. 1B).

Disclosed herein are methods for the correction of surface figure error of an optical substrate in mixed mode between sub-aperture and full aperture processing. This is done by utilizing a line-removal process that provides a line-removal function that can continually scale to accommodate up to the full-width of the substrate and repeating such full-width removal processes for different angularly orientations of the substrate to collectively achieve variable surface profiling along all necessary directions. For example, the surface error correction necessary to achieve a target surface provide is decomposed into angular components, and the optical surface is then processed with a collective set of full-width line-removal processes for respective angular orientations of the substrate that achieve the surface error correction all those angular components.

In one embodiment, the line-removal process is a wet acid that will continually etch the portion of the substrate that is in contact with the solution. In another embodiment, the line-removal process is any process that provides a line contact with the optical surface, such as conventional polishing, MRF polishing, or IBF techniques that are modified to be laterally extended and thereby provide a line-removal function. In certain embodiment, the decomposition of the surface error correction into angular components is performed by expressing the surface error correction in terms of coefficients for Zernike polynomial (as is conventionally done, although expression in terms of other functions is also possible) and decomposing the Zernike polynomials into a superposition of line functions for the different angular orientations of the substrate, as is described in more detail below.

A line-removal process allows surface error over the full aperture of the optical surface to be corrected along the dimension corresponding to the scan direction of the line-removal process (e.g., along the length of the surface), provided the removal function extends along the entire width of the aperture. One trivial example is that of a wedge correction. An extended removal function can readily impart (or remove) wedge. For example, by appropriately orienting the optical element such that the direction of the wedge is perpendicular to the removal function (which extends the entire width of the substrate) then the wedge can be controlled by traversing the length of the substrate and dwelling longer where more removal is required. More generally, in other examples, varying this removal function along the length can create curves in additional to a linear wedge (but only in the single-direction being traversed). For example, a trivial example of a curved figuring is that of a cylinder, however, any sort of curve can be imparted, provided that the variation is perpendicular to the removal function. Repeating this linear-removal process for different orientations of the substrate enables variable surface figuring along many directions.

Zernike polynomials are a fairly standard means to describe form error on optical substrates and are functions of a radial component and an angular component. These polynomials begin by describing mean error, tilt, and power and then grow in complexity as the order of the terms become larger. It is common to use up to the first thirty-six to describe a surface. Fitting even higher-order terms tends to lose practical value in many cases. For the purpose of the methods disclosed herein, however, what is important is that these polynomials can also be substantially characterized by linear traces that recombine at discrete angles. By decomposing these polynomials, the first sixteen terms can be re-expressed by corresponding superpositions of linear traces at eight discrete angle 45-degrees apart. This is to say that Zernike polynomials can be represented by a series of 1D curves (that extend the width of the substrate) at the eight different angular orientations. As a basic example, tilt in orthogonal "X" and "Y" directions are just 'curves' at two angular orientations 90-degrees apart. The same is true of power and astigmatism. These are just 'cylinders' added together with 90-degree clocking (and in the astigmatic case the cylinders are inverted). The principle likewise applies as the Zernike order grows in complexity (e.g., with respect to coma, $3^{rd}$ order spherical, etc . . . ), however, the linear combinations require clocking angles that increasingly become smaller (e.g., 45 degrees, 22.5 degrees, etc . . . ).

Figure 1B:
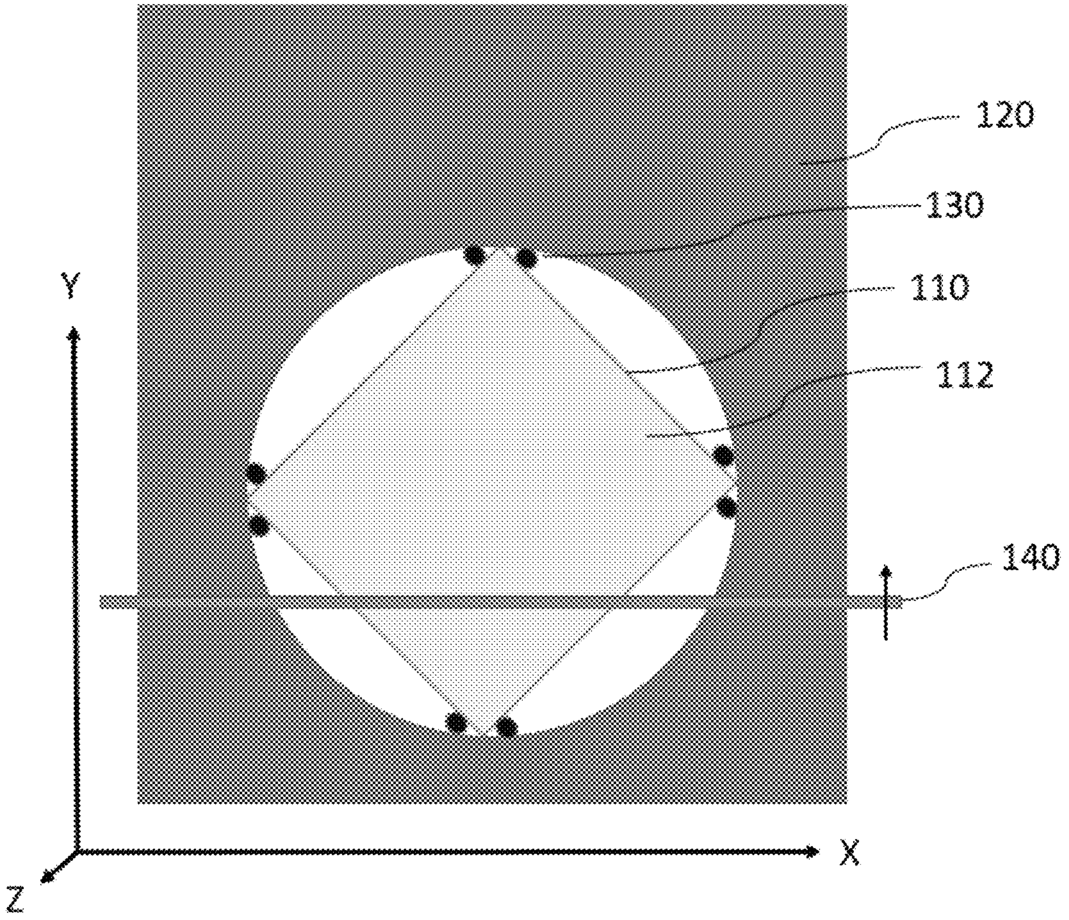

The method is illustrated schematically in FIGS. 1A and 1B. An optical element 110 having an optical surface 112 whose surface figure is to be corrected to establish a target profile is mounted in an optical mounting fixture 120 that orients the optical surface 112 relative to a line-removal process 140. In the Cartesian coordinate system illustrated in the FIGS. 1A and 1B, the optical surface 112 is nominally oriented in the X-Y plane and the line-remove process extends along X-axis. The line-remove process 140 uniformly removes material from the optical surface 112 across the full aperture of the optical surface along the direction of the X-axis. The amount of material removed, and the corresponding figuring, increases with the dwell time of the line-removal process 140 at the Y-axis coordinate for the line-removal process. To variably figure the optical surface 112 along the Y-direction, the line-removal process 140 is scanned relative to the optical surface 112 along the Y-direction with dwell times corresponding to the target profile.

To enable figuring along additional dimensions of the optical surface 112, the line removal process 140 is repeated for each of one or more additional angular orientations of the optical surface 112 relative to the line removal process 140. Specifically, the optical surface is rotated about a Z-axis perpendicular to the X- and Y-axes in the Cartesian coordinate system shown in FIGS. 1A and 1B. For example, this can be accomplished by mounting elements 130 in fixture 120 that rotatable support optical element 110 in fixture 120. Accordingly, FIG. 1B illustrates the line-removal process 140 being applied to the optical surface 112 following a 45-degree rotation of the optical surface about the Z-axis relative to the angular orientation of the optical surface in FIG. 1A. In other embodiments, the fixture 120 supporting optical element can be rotated as a whole relative to the line-removal process.

As mentioned above, in certain embodiments of the method, the line-removal process is a provided by an acid bath, and the method is illustrated below in greater detail with respect to this acid process.

Profile Etching

In describing this technique, it is appropriate to begin with the fundamental elements involved and build up to the ultimate implementation. Consider the wet etching of an optical component for stock removal using an acid bath. In practice, the etch rate will be stable and isotropic such that, by fully submerging the substrate in the acid, a uniform removal of material will be performed. The change in height (h) of the surface will be defined by $\Delta h = ER \cdot \Delta t$, where ER represents the removal rate of the acid and $\Delta t$ is the elapsed time. Technically, the etching described above qualifies as a deterministic full aperture process in the most basic form of uniform removal but as yet, there is no basis for figure control. The scenario can be adjusted slightly by introducing the concept of a partially submerged substrate. By approximating a step function defined by the interface between the air and the acid bath, the system can be re-expressed by the following equation (1).

$$\Delta h(\Delta t, y) = \begin{cases} ER \cdot \Delta t, & y = \text{in acid} \\ 0, & y = \text{in air} \end{cases} \tag{1}$$

There is now a positional dependence of the removal defined by the location (y) of a point on the substrate and it becomes more appropriate to describe the system as having a removal function instead of a removal rate. Defining the setup this way makes clear that by introducing conventional kinematics into the system it is possible to obtain controlled non-uniformity of the etching in a similar fashion as that employed in many sub aperture processes. For example, an initial implementation is that of a controlled immersion of a substrate into the acid at a fixed velocity in order to correct wedge.

Wedge is simply a linear amplitude gradient that exists about a given length (L) of a substrate. To correct a wedge, it is necessary to preferentially etch the thicker portion of the substrate by lowering the substrate into the acid bath in a controlled fashion. Since there is freedom to choose the substrate orientation, the amplitude gradient is defined to have a maximum deviation ($\Delta h = h_{max}$) at the bottom of the substrate and ($\Delta h = 0$) at the top. From equation (1), the time ($\Delta t$) required to remove $h_{max}$ is simply $h_{max}/ER$. Therefore, the immersion velocity ($v_y$) is equal to $L/\Delta t$. Substituting for $\Delta t$ and noting that $L/h_{max}$ can be defined as the inverse of the surface slope ($m_{wedge}$), the final velocity required to correct (or impart) the wedge is defined in equation (2).

$$v_y = \frac{ER}{m_{wedge}} \tag{2}$$

There is an implicit requirement that the slope (m) must be positive (m>0), which would prove restricting when expanding the figure correction beyond wedge. However, there is an easy solution. Because the removal is independent of any position (x) along the width, the rotation of the substrate by 180° serves to invert the target profile. Therefore, negative slopes (m<0) will become positive in what will be a mirrored version of the profile. Thus $m_{180}=-m$ and the correction again becomes possible. The importance of this relation will become apparent when expanding the concept to arbitrary profiles.

Now assume there exists a function h(y) that represents an arbitrary amplitude variation about y. Traversing along the profile h(y) by an arbitrary distance $\Delta y$ will have an associated change in profile amplitude $\Delta h$, thereby the concept of wedge ($\Delta h/\Delta y$) is reintroduced on a local scale, and a new velocity function v(y) can be established to perform the local correction. As the limit of $\Delta y \rightarrow 0$, the slope m(y) is the derivative of the surface profile at location y, thus m(y)=dh/dy and v(y)=ER/m(y). Given the arbitrary nature of h(y), the sign of the slope will also be arbitrary. As noted above, a single immersion process can only correct positive slopes. However, as also noted above, a second immersion process with a rotation of the substrate by 180° will convert negative slopes to positive ones. Thus, a complete change to the surface profile is performed in rotated pairs and the final correction equation is as follows, where the subscripts dictate the separate 0° and 180° increments.

$$v(y)_{0,180} = \begin{cases} \dfrac{ER}{\left(\dfrac{dh_{0,180}}{dy}\right)}, & \left(\dfrac{dh_{0,180}}{dy}\right) > 0 \\ \infty, & \left(\dfrac{dh_{0,180}}{dy}\right) \leq 0 \end{cases} \tag{3}$$

It should be noted that in the situation where the slopes are negative and the velocity equates to infinity, there would be no removal in theory. In practice, the velocity is maximized to the constraints of the system and some minimal removal is unavoidable.

There now exists a means to impart any general profile h(y) onto the surface(s) of an optical component using a wet acid bath. However, the dependence on y only is limiting, and it is demonstrated in the following section that the removal function can be expanded beyond this limitation. In fact, the concept of decomposing Zernike polynomials (which are functions of x and y) into angular components that are dependent on y and immersion angle $\theta$ is introduced, and it will be shown that the acid etch process can be used to recreate these polynomials.

Zernike Decomposition

Figure 3:
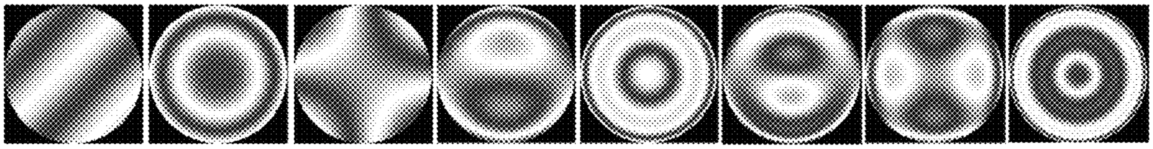
FIG. 3 is a graphical representation in X-Y of the eight Zernike polynomials up to fourth-order spherical.

As was noted above, Zernike polynomials are a fairly standard means to describe form error on optical substrates. They are most familiarly recognized by the descriptions of the early terms (power, coma, astigmatism, trefoil, etc . . . ) but consist of an infinite series of orthogonal functions of increasing complexity. FIG. 2 is a table providing the first thirty-six Zernike polynomials in terms of the radial component "ρ" and an angular component "Ø". As is readily apparent, the expressions of these polynomials become cumbersome when fully expanded, and so will the expressions associated with the decomposition into angular components. Therefore, it will be practical to switch to a graphical representation and it will be understood that the descriptions that follow can be demonstrated (and proven) computationally. FIG. 3 is a graphical representation of eight Zernike polynomials up to $4^{th}$ order spherical.

In order to recreate the first series of Zernike profiles shown in FIG. 3 using the etching method described above, the wet etch immersion process is repeated as varying discrete angles. To correct for the nine Zernike polynomials illustrated in FIG. 3, the angles are confined to 45° increments. Of course, in other embodiments and/or for correcting even higher-order Zernike polynomials smaller angle increments can be used. Additionally, since profiling is done in pairs (0° and 180° apart), reference to future immersion angles will be described by the first orientation only and the repeated 180° etch will be implied. Therefore, the immersion angles will be designated as $\theta_i$ and i will assume the values 0, 45, 90, 135 . . . 315.

Figure 4:
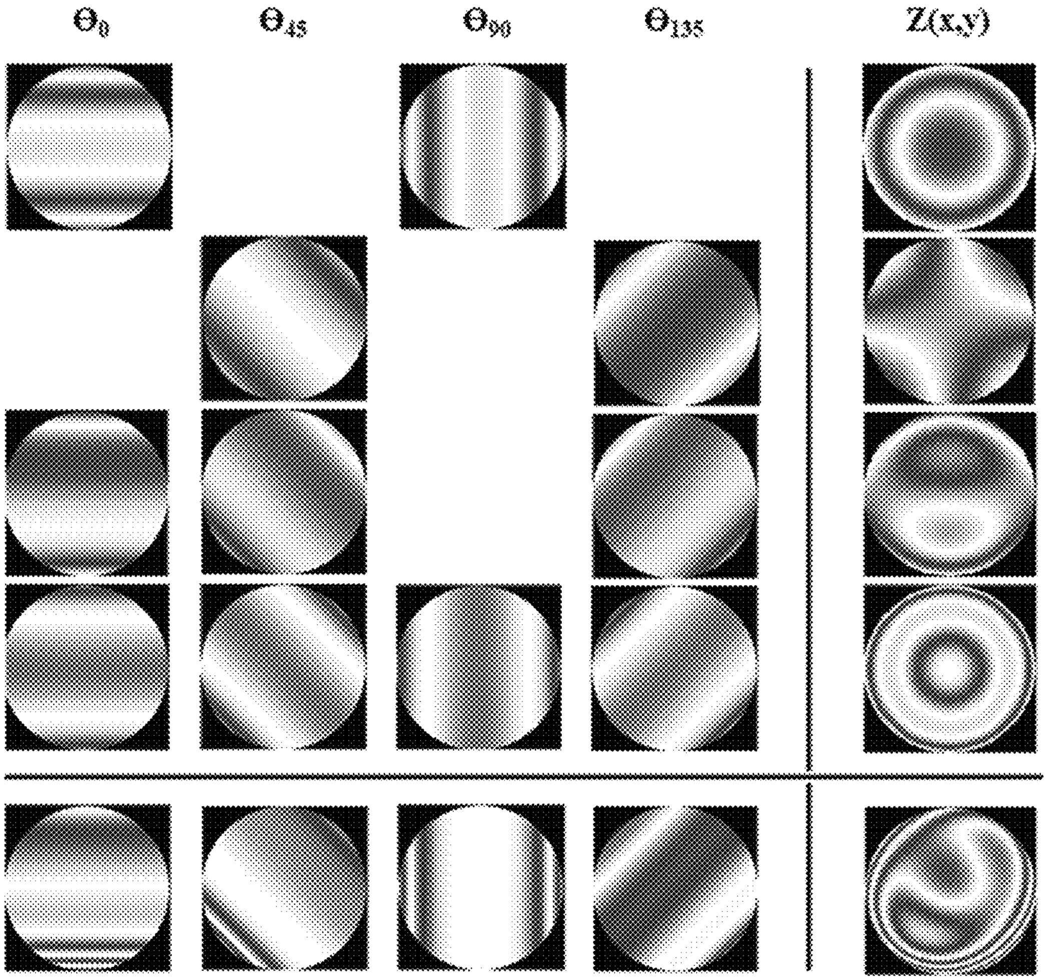
FIG. 4 is graphical matrix of graphically illustrating how superposition of one-dimension surface profiling at different angular orientations can produce surface profiles corresponding to different Zernike polynomials.

FIG. 4 graphically illustrates how one-dimension profiling at each of several of these different immersion angles can be combined in superposition to create a specific profiling multi-dimensional profiling corresponding to a Zernike polynomial. Specifically, the images on the top left in FIG. 4 demonstrate how the Zernike polynomials can be split into angular components that are merely functions of one variable (y) if properly oriented, and can therefore be corrected using the etch profiling method. Each individual immersion will act to linearly recombine the individual profiles to recreate the appropriate Zernike (the summation of each profile from left to right in FIG. 4). In the cases shown for power, astigmatism, coma, and $3^{rd}$ order spherical, a complete recreation can be performed by as few as 4 discrete angles. It can be shown that the first 16 terms can be recreated as above in as few as 8 rotations. Higher order terms require more rotations.

It is not necessary that each individual polynomial used to describe the surface be imparted sequentially. Each discrete angle will have contributions from each Zernike term and can be profiled concurrently based upon the sums of the profiles at each angle (the summation of each profile from top to bottom in FIG. 4). Returning back to the mathematical model, a slight modification can be made to equation (3) to include the angular rotation and a new function $Z_n(y)$ is created for each immersion angle ($\theta$), where $Z_n$ represents the angular profile associated with the $n^{th}$ Zernike term. The complete picture is represented in equations (4) and (5) where $\theta$ will assume the values 0,45, . . . ,315.

$$h(y)_\theta = \sum_{n=1}^{n=16} Z(y)_{n,\theta} \tag{4}$$

$$v(y)_\theta = \begin{cases} \dfrac{ER}{\left(\dfrac{dh(y)_\theta}{dy}\right)}, & \left(\dfrac{dh(y)_\theta}{dy}\right) > 0 \\ \infty, & \left(\dfrac{dh(y)_\theta}{dy}\right) \leq 0 \end{cases} \tag{5}$$

By way of example only, a matrix representation for the one-dimension correction along the Y-axis for the eight 45-degree increment rotations necessary to correct for a surface error correction expressed in terms of the first sixteen Zernike polynomials ($z_1, z_2, \ldots z_{16}$) is shown in FIG. 5. The lower-order terms require only one discrete orientation while the amount of clocking required increases as the terms go to higher order. The matrix shows the Zernike terms increasing in order by row and the discrete angular breakdown along the columns (at 45 degree increments). The decoupling of the equations is not necessarily unique and the values populating the matrix are but one possible solution.

EXAMPLES

In this section, examples of two components that have been processed will be described. Additionally, there are some unique advantages of the process that will be highlighted concerning optical window manufacturing, minimization of edge effects, aspherization, scalability towards large substrates, and bulk processing. In regards to the practical process implementation, the optics referenced below were fused silica (SiO2) and etched using a buffered hydrofluoric acid solution (BOE).

Figures 6A, 6B:
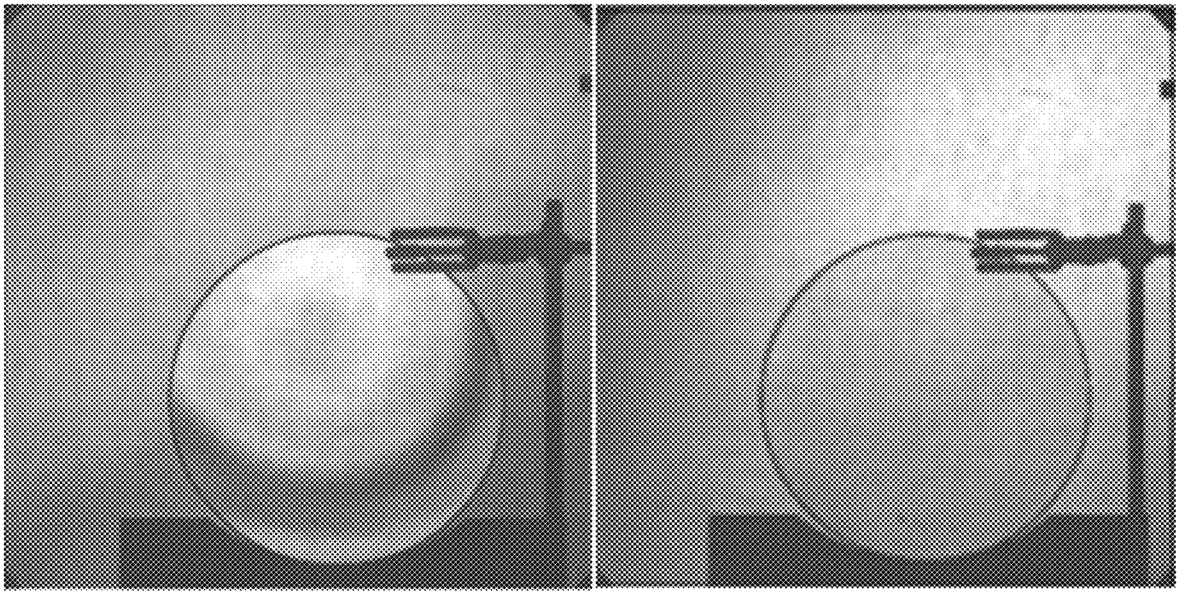
FIGS. 6A and 6B are images of the transmitted wavefront error (TWE) of a fused silica window measured before (6A) and after (6B) profile etching.

In the first example, the transmitted wavefront error (TWE) of a fused silica window was measured before and after profile etching. A comparison was made between the Zernike coefficients used to describe the wavefront error and a very high convergence was achieved and is demonstrated in FIGS. 6A (before) and 6B (after) and Table 1 below.

TABLE 1

| Zernike Description | Initial (waves) | Post-Etch (waves) |
| --- | --- | --- |
| Tilt X | −0.069 | 0.000 |
| Tilt Y | 0.275 | 0.001 |
| Focus | −0.151 | 0.000 |
| Astig 0, 90 | 0.017 | 0.001 |
| Astig +− 45 | −0.014 | 0.012 |
| X Coma | 0.005 | −0.003 |
| Y Coma | −0.008 | 0.005 |
| Sphere | 0.010 | 0.005 |

Because the component was an optical window and the requirement was specified in TWE, both surfaces could be processed at the same time. The double sided application of the process highlights a potential advantage in a production environment since this will effectively double the removal rate of the correction. Another benefit is shown in the fidelity of the data out to the very edge of the substrate. The edge effect from processing is too small to be quantified from the associated data taken and this demonstrates another advantage of the process.

Figure 7:
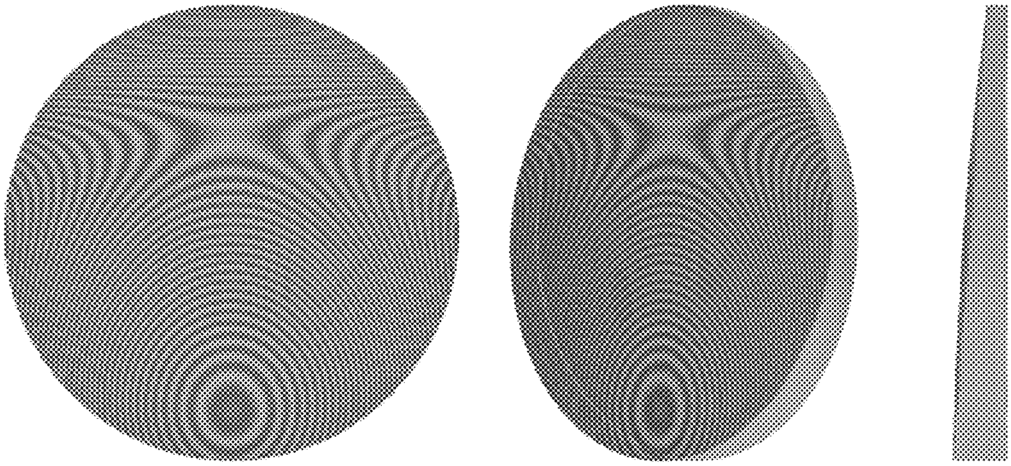
FIG. 7 is a set of three different perspective images of a synthetic fringe overlay of a scaled version of an aspherical surface profiling departure applied to a plano-convex lens implemented by the method disclosed herein.

In the second example, the process was utilized to aspherize the surface of a curved geometry as oppose to correcting the figure error of the planar geometry of a window. The aspheric departure was characterized by the conic (k) only and the deviation was completely described by Zernike polynomials up to $3^{rd}$ order spherical. For visualization purposes, a synthetic fringe overlay of a scaled version of the aspheric departure is shown in FIG. 7. In this application, the process was implemented for bulk convergence towards the final surface profile and used in a complementary fashion with other deterministic finishing techniques to fully fabricate the optic. Two significant advantages of the process are highlighted in this example. The first is the demonstration of the independence of the etching on the surface geometry. The acid will always contour to the geometry of the surface and by (mathematically) projecting the desired profile onto a virtual plane, the process can be readily applied. The second is a less apparent benefit from the double-sided nature of the process. Since the etching was performed simultaneously on both surfaces of the optic, the profile change on the planar surface was equal to the change on the curved geometry of the aspheric surface. In this situation, it was possible to leverage existing interferometric capability for planar surfaces in order to characterize the opposing surface profile where the equivalent capability was unavailable.

So far, there has been little reference to removal rates of the process. In part, this is due to the fact that the etch rates can vary dramatically based on concentration and temperature. However, there is also the notion of an effective removal rate in the etch process that must be highlighted. Although the etch rate is stable at a fixed temperature (and concentration), the ultimate volumetric removal rate on the substrate will vary with the size of the substrate and this is subtly implied from equation (2) regarding wedge correction. It can be noted that, for a given amplitude of correction, if the length of the substrate gets larger, then the velocity will scale proportionately. In other words, the processing time is the same independent of the size of the substrate and the volumetric removal rate of the system is not a constant.

As an example, consider a typical etch rate of ~80 nm/min and a 100 mm diameter circular substrate. In order to correct 1 um of wedge the associated velocity will be 8 mm/min and the correction will take 12.5 minutes. If the diameter is increased to 1000 mm, the velocity goes to 80 mm/min and the correction time remains the same. Of course, the amount of material removed has increased by a factor of a hundred and the effective removal rate jumps from ~0.3 mm$^3$/min to ~30 mm$^3$/min. Thus, one of the primary advantages of the etch profiling technique is exemplified by the drastic increase in removal efficiency as the substrates grow in size.

The acid profiling approach has proven to be very useful for establishing an efficient deterministic process that satisfies the process time (high removal rate) and geometry restraints involved in optics manufacturing. The stability of the acid etch rate contributes to the high level of determinism and provides some freedom of use for many different sizes and geometries of a substrate. Combined with the kinematics of orientation and velocity, this mix between a full and sub aperture approach has also demonstrated some desirable volumetric removal rate efficiencies, especially when applied to increasingly larger substrates.

Further Examples and Variations

The specific examples above have involved processing a single optical substrate. However, it is also possible to carry out bulk processing of more than one substrate, especially where the substrates have like geometries and the desired removal is consistent across each substrate. All this required is appropriate conventional tooling.

The specific examples above were limited to polished substrates nearing completion. However, there are many processes and technologies involved in the manufacturing of an optical substrate and the acid profiling technique can also be used in a complementary fashion to support to support such other processes and technologies. For example, the methods disclosed herein can be used for bulk shaping in the early fabrication stages of an optical element and also to fabricate optical elements with complex freeform surfaces to leverage the geometry independence of the methods.

As noted above, the methods are not limited to an etch bath for the line-removal process. In other variations, the line-removal process is any process that provides a line contact with the optical surface, such as conventional polishing, MRF polishing, or IBF techniques that are modified to be laterally extended and thereby provide a line-removal function. For example, an ion beam source for IBF can be configured to provide a line profile instead of a spot profile (e.g., for one dimension is at least ten times larger than an orthogonal dimension). Similarly, for example, a spherical head for MRF can be replaced with a cylindrical head.

Furthermore, when using an etch bath for the line-removal process, variations including varying the etch rate of the bath during each of one or more of the immersion processes and/or as between different ones of the ones of the immersion processes. This can be done, for example, by varying the temperature of the etch bath to vary its etch rate and/or varying the composition of the etch bath to vary the etch rate.

While this specification contains many specific implementation details, these should not be construed as limitations on the scope of any inventions or of what may be claimed, but rather as descriptions of features specific to particular embodiments of particular inventions.

Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

A number of embodiments of the invention have been described. Nevertheless, it will be understood that various modifications may be made without departing from the spirit and scope of the invention. Accordingly, other embodiments are within the scope of the following claims.

What is claimed is:

1. A method for figuring an optical surface of an optical element to achieve a target profile for the optical surface, the method comprising:

a. applying a removal process to an extended region of the optical surface extending along a first direction to remove material from the extended region of the optical surface; and b. adjusting a position of the optical surface relative to the removal process along a second direction perpendicular to the first direction to remove material from additional extended regions of the optical surface extending along the first direction at each of different positions of the optical surface along the second direction, c. wherein, during the applying of the removal process and the adjusting of the optical surface relative to the removal process, the optical surface has a first rotational orientation about a third direction perpendicular to the first and second directions, and d. wherein the method further comprises:

repeating the applying of the removal process and the adjusting of the optical surface relative to the removal process for each of one or more additional rotational orientations of the optical surface about the third direction to achieve the target profile of the optical surface, wherein the removal process is an etching process wherein at least part of the optical surface is immersed into an etching bath, wherein the adjusting of the optical surface relative to the removal process comprises immersing the optical surface into the etching bath along the second direction, wherein immersing the optical surface into the etching bath along the second direction comprises varying a speed of the immersion of the optical surface into the etching bath along the second direction to cause a rate at which the material at the additional extended regions of the optical surface extending along the first direction are removed at each of the different positions of the optical surface along the second direction to vary nonlinearly with respect to distance along the second direction.

2. The method of claim 1, wherein the extended regions of the optical surface that are immersed in the etching bath have material continuously removed by the etching bath in proportion to a dwell time in the etching bath for each of the extended regions.

3. The method of claim 1, wherein the target profile of the optical surface comprises any of a wedge surface, a spherical surface, an aspherical surface, and a free-form surface.

4. A method for figuring an optical surface of an optical element to achieve a target profile for the optical surface, the method comprising:

a. applying a removal process to an extended region of the optical surface extending along a first direction to remove material from the extended region of the optical surface; and b. adjusting a position of the optical surface relative to the removal process along a second direction perpendicular to the first direction to remove material from additional extended regions of the optical surface extending along the first direction at each of different positions of the optical surface along the second direction, c. wherein, during the applying of the removal process and the adjusting of the optical surface relative to the removal process, the optical surface has a first rotational orientation about a third direction perpendicular to the first and second directions, and d. wherein the method further comprises:

repeating the applying of the removal process and the adjusting of the optical surface relative to the removal process for each of one or more additional rotational orientations of the optical surface about the third direction to achieve the target profile of the optical surface, and further comprising expressing the target profile for the figuring of the optical surface as a superposition of polynomial functions of a coordinate for the second dimension for each of the first rotational orientation and the one or more additional rotational orientations.

5. The method of claim 4, wherein the extended region of the optical surface extending along the first direction from which material is removed by the removal process extends across a full aperture of the optical surface along the first direction.

6. The method of claim 4, wherein the removal process is an etching process wherein at least part of the optical surface is immersed into an etching bath.

7. The method of claim 6, wherein the adjusting of the optical surface relative to the removal process comprises immersing the optical surface into the etching bath along the second direction.

8. The method of claim 6, wherein the method further comprising adjusting a temperature of the etchant bath to adjust an etching rate for the removal process.

9. The method of claim 4, wherein adjusting the position of the optical surface relative to the removal process along the second direction comprises varying a speed of the relative positioning along the second direction to cause a rate at which the material at the additional extended regions of the optical surface extending along the first direction are removed at each of the different positions of the optical surface along the second direction to vary nonlinearly with respect to distance along the second direction.

10. The method of claim 4, further comprising mounting the optical element in a fixture to establish an initial rotational orientation of the optical surface about the third direction prior to an initial application of the removal process to the optical surface.

11. The method of claim 10, further comprising reorienting the optical element in the fixture to establish each of the one or more additional rotational orientations of the optical surface prior to repeating each of the corresponding applications of the removal process and adjustments of the optical surface relative to the removal process.

12. The method of claim 4, wherein the first rotational orientation and the one or more additional rotational orientations collectively comprise at least four different rotational orientations.

13. The method of claim 12, wherein the at least four different rotational orientations comprise eight different rotational orientations.

14. The method of claim 12, wherein the at least four different rotational orientations are selected from rotations corresponding to integer multiples of 45 degrees.

15. The method of claim 4, wherein the adjustment of the optical surface relative to the removal process along the second direction for each of the first rotational orientation and the one or more additional rotational orientations is based on the polynomial function for each corresponding one of the first rotational orientation and the one or more additional rotational orientations.

16. The method of claim 15, wherein a speed of the adjustment of the optical surface relative to the removal process along the second direction for each of the first rotational orientation and the one or more additional rotational orientations corresponds to a derivative of the polynomial function with respect to the coordinate for the second dimension for each corresponding one of the first rotational orientation and the one or more additional rotational orientations.

17. The method of claim 4, wherein a desired profile for the figuring of the optical surface can be expressed in terms of coefficients for a set of Zernike polynomials, and where the method comprises approximating the desired profile with the target profile expressed as the superposition of polynomial functions for each of the first rotational orientation and the one or more additional rotational orientations.

18. The method of claim 4, wherein a full aperture of the optical surface is greater than 25 cm.

19. The method of claim 4, wherein a full aperture of the optical surface is greater than 50 cm.

20. The method of claim 4, wherein a full aperture of the optical surface is greater than 100 cm.

21. The method of claim 4, wherein the removal process is laterally extended along the first direction to simultaneously remove the material from the region of the optical surface extending along the first direction.

22. The method of claim 4, wherein the removal process is laterally extended along the first direction to uniformly remove the material from the region of the optical surface extending along the first direction.

23. The method of claim 4, wherein the removal process is an ion beam etching process.

24. The method of claim 23, wherein a dimension of the ion beam for the ion beam etching process along the first direction is at least ten times greater than a dimension of the ion beam along the second direction.

* * * * *